United States Patent
Mouridsen (10) Patent No.: US 10,948,550 B2
(45) Date of Patent: Mar. 16, 2021

(54) POWER DEVICE WITH ELECTROLYTIC CAPACITORS

(71) Applicant: SCHNEIDER ELECTRIC IT CORPORATION, West Kingston, RI (US)

(72) Inventor: Jonas Sonsby Mouridsen, Odense V (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 132 days.

(21) Appl. No.: 16/026,229

(22) Filed: Jul. 3, 2018

(65) Prior Publication Data

US 2020/0011919 A1 Jan. 9, 2020

(51) Int. Cl.
| | | |
|---|---|---|
| G01R 31/64 | (2020.01) | |
| G01R 31/40 | (2020.01) | |
| H02H 7/16 | (2006.01) | |
| H02J 7/34 | (2006.01) | |
| H02J 9/06 | (2006.01) | |
| H02M 1/088 | (2006.01) | |
| H02M 7/483 | (2007.01) | |
| H02M 1/00 | (2006.01) | |

(52) U.S. Cl.
CPC .......... *G01R 31/64* (2020.01); *G01R 31/40* (2013.01); *H02H 7/16* (2013.01); *H02J 7/345* (2013.01); *H02J 9/061* (2013.01); *H02J 9/062* (2013.01); *H02M 1/088* (2013.01); *H02M 7/483* (2013.01); *H02M 2001/0006* (2013.01); *H02M 2007/4835* (2013.01)

(58) Field of Classification Search
None
See application file for complete search history.

(56) References Cited

U.S. PATENT DOCUMENTS

| | | | | |
|---|---|---|---|---|
| 7,023,107 | B2* | 4/2006 | Okuda | H02J 7/1438 |
| | | | | 307/10.1 |
| 2009/0112493 | A1* | 4/2009 | Abdennadher | G01R 27/2605 |
| | | | | 702/58 |
| 2010/0161259 | A1* | 6/2010 | Kim | G05B 23/0283 |
| | | | | 702/63 |
| 2013/0057297 | A1* | 3/2013 | Cheng | H02M 1/32 |
| | | | | 324/548 |
| 2015/0268709 | A1 | 9/2015 | Morning-Smith et al. | |

FOREIGN PATENT DOCUMENTS

CN 107797001 A 3/2018

OTHER PUBLICATIONS

Extended European Search Report from corresponding European Application No. 19182728.6 dated Oct. 22, 2019.

* cited by examiner

*Primary Examiner* — Nasima Monsur
(74) *Attorney, Agent, or Firm* — Lando & Anastasi, LLP (57) ABSTRACT

An Uninterruptible Power Supply (UPS) system is provided which includes an input configured to receive input power, an output configured to provide output power to a load, power conversion circuitry coupled to the input and the output, a capacitor coupled to the power conversion circuitry, and a controller coupled to the power conversion circuitry. The controller is configured to determine a first value indicative of an equivalent series resistance of the capacitor, determine, based on the first value, if the capacitor satisfies at least one criterion, and execute, responsive to determining that the relative value satisfies the at least one criterion, one or more actions to address degradation of the capacitor.

14 Claims, 6 Drawing Sheets

POWER DEVICE WITH ELECTROLYTIC CAPACITORS

BACKGROUND OF THE INVENTION

1. Field of the Invention

At least one example in accordance with the present invention relates generally to capacitor analysis.

2. Discussion of Related Art

The use of capacitors in power devices, such as Uninterruptible Power Supplies (UPSs), is known. For example, certain power devices may implement electrolytic capacitors.

Electrolytic capacitors are polarized capacitors having an anode constructed of a metal, such as aluminum, tantalum, or niobium. The anode is placed in a solid or non-solid electrolyte bath, which behaves as the cathode of the capacitor. An insulting oxide layer formed on the anode behaves as an insulating dielectric. Electrolytic capacitors are prone to eventual failure, known in the art as "drying out."

SUMMARY

According to at least one aspect of the present invention, an Uninterruptible Power Supply (UPS) system is provided which includes an input configured to receive input power, an output configured to provide output power to a load, power conversion circuitry coupled to the input and the output, a capacitor coupled to the power conversion circuitry, and a controller coupled to the power conversion circuitry. The controller is configured to determine a first value indicative of an equivalent series resistance of the capacitor, determine, based on the first value, if the capacitor satisfies at least one criterion, and execute, responsive to determining that the relative value satisfies the at least one criterion, one or more actions to address degradation of the capacitor.

In one embodiment, the UPS system includes a filter coupled in parallel with the capacitor. In some embodiments, the controller is configured to determine a second value indicative of a voltage across the filter, and determine at least one third value indicative of at least one current through the power conversion circuitry. In at least one embodiment, the controller is configured to determine the first value indicative of the equivalent series resistance of the capacitor based on the second value indicative of the voltage across the filter and based on the at least one third value indicative of the at least one current through the power conversion circuitry.

In some embodiments, determining that the capacitor satisfies the at least one criterion includes determining that the at least one criterion exceeds a first threshold. In one embodiment, the one or more actions include notifying a user of the degradation of the capacitor. In at least one embodiment, determining that the capacitor satisfies the at least one criterion includes determining that the at least one criterion exceeds a second threshold. In one embodiment, exceeding the second threshold includes determining that the first value is at least four times larger than the baseline value. In some embodiments, the one or more actions include initiating a safe shutdown of the UPS system.

According to one aspect of the present disclosure, a method for detecting degradation of performance of a capacitor in a device is provided. The method includes determining a first value indicative of an equivalent series resistance of the capacitor, determining, based on the first value, that the capacitor satisfies at least one criterion, and executing, responsive to determining that the relative value satisfies at least one criterion, one or more actions to address degradation of the capacitor.

In some embodiments, determining the first value indicative of the equivalent series resistance of the capacitor includes determining a voltage value across the capacitor, determining a current value through the capacitor, and determining an impedance of the capacitor based on the voltage value and the current value. In one embodiment, the method includes determining a plurality of values indicative of the equivalent series resistance of the capacitor, generating, using the plurality of values indicative of the equivalent series resistance of the capacitor, a baseline value, and storing the baseline value.

In one embodiment, the method includes normalizing the first value indicative of the equivalent series resistance according to an ambient temperature. In at least one embodiment, determining that the capacitor satisfies the at least one criterion includes determining that the at least one criterion exceeds a first threshold. In some embodiments, exceeding the first threshold includes determining that the first value is approximately two times larger than the baseline value.

In some embodiments, the one or more actions include notifying a user of the degradation of the capacitor. In at least one embodiment, determining that the capacitor satisfies the at least one criterion includes determining that the at least one criterion exceeds a second threshold. In one embodiment, exceeding the second threshold includes determining that the first value is approximately four times larger than the baseline value. In at least one embodiment, the one or more actions include initiating a safe shutdown of the device.

According to some aspects, an Uninterruptible Power Supply (UPS) system is provided. The UPS system includes an input configured to receive input power, an output configured to provide the input power to a load, power conversion circuitry coupled to the input and the output, a capacitor coupled to the power conversion circuitry, and means for detecting degradation of the capacitor.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE INVENTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Electrolytic capacitors provide several advantages compared to alternate types of conventional capacitors. For example, electrolytic capacitors typically provide more capacitance per unit volume than any other type of conventional capacitor. Electrolytic capacitors are frequently implemented in certain power devices (for example, an Uninterruptible Power Supply [UPS], such as the Symmetra® PX UPS available from Schneider Electric SE) where, for example, a high capacitance density is advantageous.

However, as discussed above, electrolytic capacitors may dry out after a period of time, which may make the capacitors less effective. For example, the capacitor may overheat and potentially damage or destroy the electrolytic capacitor and the device in which the electrolytic capacitor is implemented. Because of the potential failures associated with electrolytic capacitors, it would be advantageous to be able to detect and address capacitor degradation, such that a user may know when to replace an electrolytic capacitor that is at or near the end of its lifetime.

However, predicting a remaining electrolytic capacitor lifetime is difficult. Electrolytic capacitor lifetime is highly dependent on factors such as ambient operating temperature, operating conditions (for example, voltage stress and ripple current), and other factors that are unknown at the time of manufacture. For example, electrolytic capacitors in devices implemented in relatively high-ambient-temperature environments are likely to fail sooner than electrolytic capacitors in devices implemented in relatively low-ambient-temperature environments.

In view of the foregoing, it is to be appreciated that it would be advantageous to calculate a predicted electrolytic capacitor lifetime in real-time to determine if the capacitor should be replaced. In at least one embodiment described herein, an electrolytic capacitor lifetime is estimated by determining an Equivalent Series Resistance (ESR) of the electrolytic capacitor. When the capacitor ESR reaches a specific value (for example, double the capacitor ESR at the time of manufacture), action may be taken to prevent failure of the capacitor.

Figure 1:
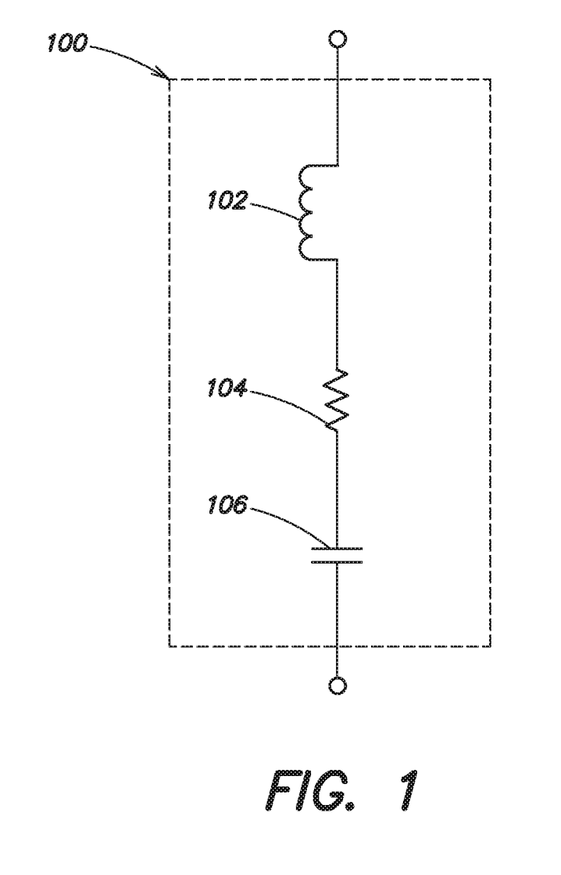
FIG. 1 illustrates a typical equivalent circuit of an electrolytic capacitor.

FIG. 1 illustrates an equivalent circuit diagram of an electrolytic capacitor 100. The electrolytic capacitor 100 includes an Equivalent Series Inductance (ESL) 102, an ESR 104, and an ideal capacitor 106. The ESL 102, the ESR 104, and the ideal capacitor 106 are coupled in series. The ESL 102 represents an internal inductance of the electrolytic capacitor 100. The ESR 104 represents an internal resistance of the electrolytic capacitor 100. The ideal capacitor 106 represents an ideal capacitance of the electrolytic capacitor 100.

As the electrolytic capacitor 100 ages, the physical properties of the electrolytic capacitor 100 may change. For example, the resistance of the ESR 104 may increase with time. In some embodiments, the value of the ESR 104 at an "end of life" time (i.e., a time at which a device designer recommends replacing the electrolytic capacitor) may be 200% of the value of the ESR 104 at the time of manufacture.

Accordingly, it may be possible to correlate the remaining lifetime of the electrolytic capacitor 100 to the value of the ESR 104. The increase in the value of the ESR 104 may be linear or non-linear with respect to time. In some examples, there may be a substantially negligible change in value for a relatively long period of time followed by a substantial change in the value over a relatively short period of time.

Figure 2A:
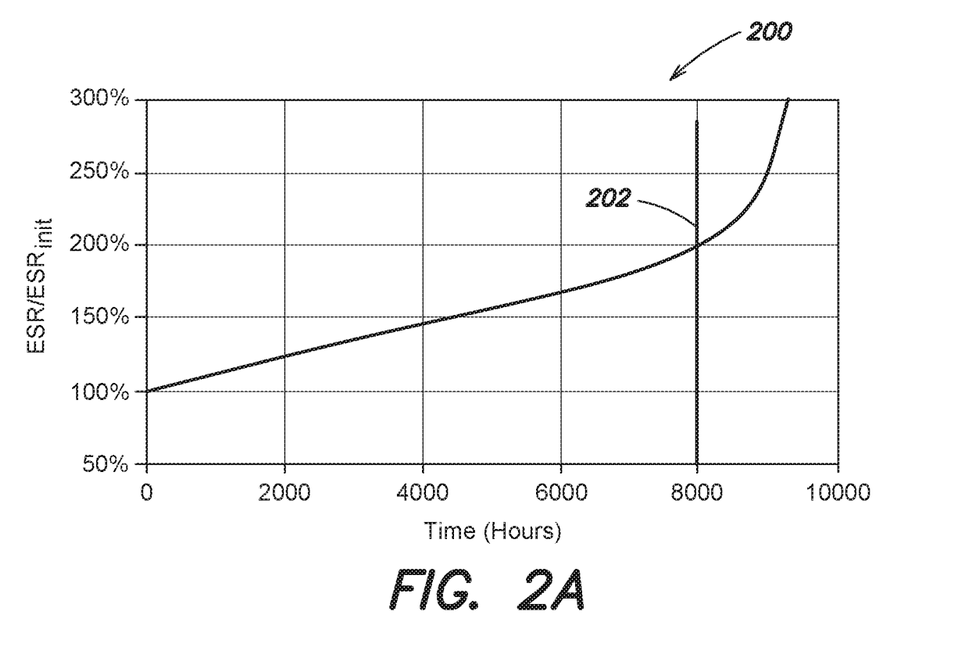
FIG. 2A illustrates a graph of a capacitor Equivalent Series Resistance (ESR) with respect to time.

FIG. 2A illustrates a graph 200 of a relative ESR value of an electrolytic capacitor with respect to time. For example, the graph 200 may represent the ESR 104 of the electrolytic capacitor 100. The horizontal axis of the graph 200 represents an elapsed time. For example, the elapsed time may be total time since the capacitor was installed in a device, or total time that the device has been active (for example, electrically active) since installation.

The vertical axis of the graph 200 represents a relative value of the real-time value of the ESR 104 with respect to a baseline value, expressed as a percentage. For example, where a real-time value is 100 mΩ, and the baseline value is 50 mΩ, the real-time value is 200% of the baseline value. The baseline value may be a fixed ESR value calculated from similar or identical capacitors at a time of manufacture, or may be a calibrated value that is determined when the device is manufactured or initially used.

In the example illustrated by FIG. 2A, the ESR 104 of the electrolytic capacitor 100 increases at a substantially linear rate for the first 8,000 hours until a time $t_1$ 202. At the time $t_1$ 202, the relative value of the ESR 104 of the electrolytic capacitor 100 reaches a value of approximately 200% and begins to increase at a substantially exponential rate. The relative value of 200% may be considered a threshold value, after which the value of the ESR 104 increases at a significant rate due to failure of the electrolytic capacitor 100. Accordingly, as discussed in greater detail below with respect to FIG. 3, when the ESR 104 reaches the threshold value the electrolytic capacitor 100 may be considered to be at or near an end of life. In alternate embodiments, the electrolytic capacitor 100 may be considerable to be at or near an end of life at any other relative value.

Figure 2B:
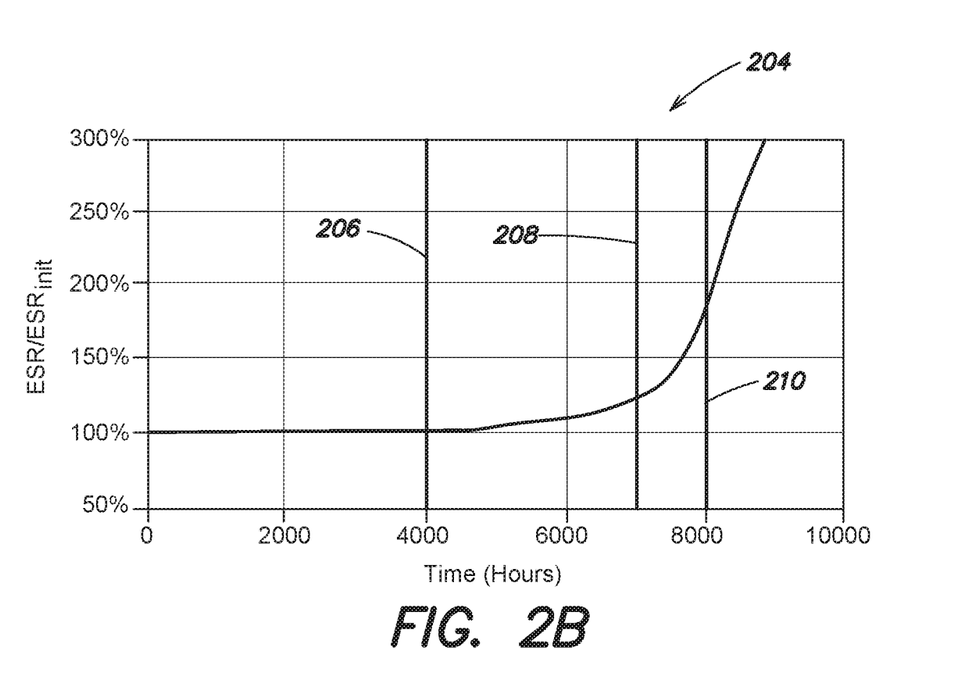
FIG. 2B illustrates a graph of a capacitor Equivalent Series Resistance (ESR) with respect to time.

FIG. 2B illustrates a graph 204 of a relative ESR value of an electrolytic capacitor with respect to time. For example, the graph 204 may represent the ESR 104 of the electrolytic capacitor 100. The graph 204 is substantially similar to the graph 200, except that the ESR 104 changes at a different rate with respect to time.

The relative ESR value is substantially constant for a first period of time until a first time $t_1$ 206. After the first time $t_1$ 206, the relative ESR value begins to increase at a substantially linear rate until a second time $t_2$ 208. After the second time $t_2$ 208, the relative ESR value begins to increase at a substantially exponential rate. At a third time $t_3$ 210, the relative ESR value of the electrolytic capacitor 100 reaches a threshold value of 200%. As discussed above, the threshold value may indicate that the electrolytic capacitor 100 is at or near an end of life.

Figure 3:
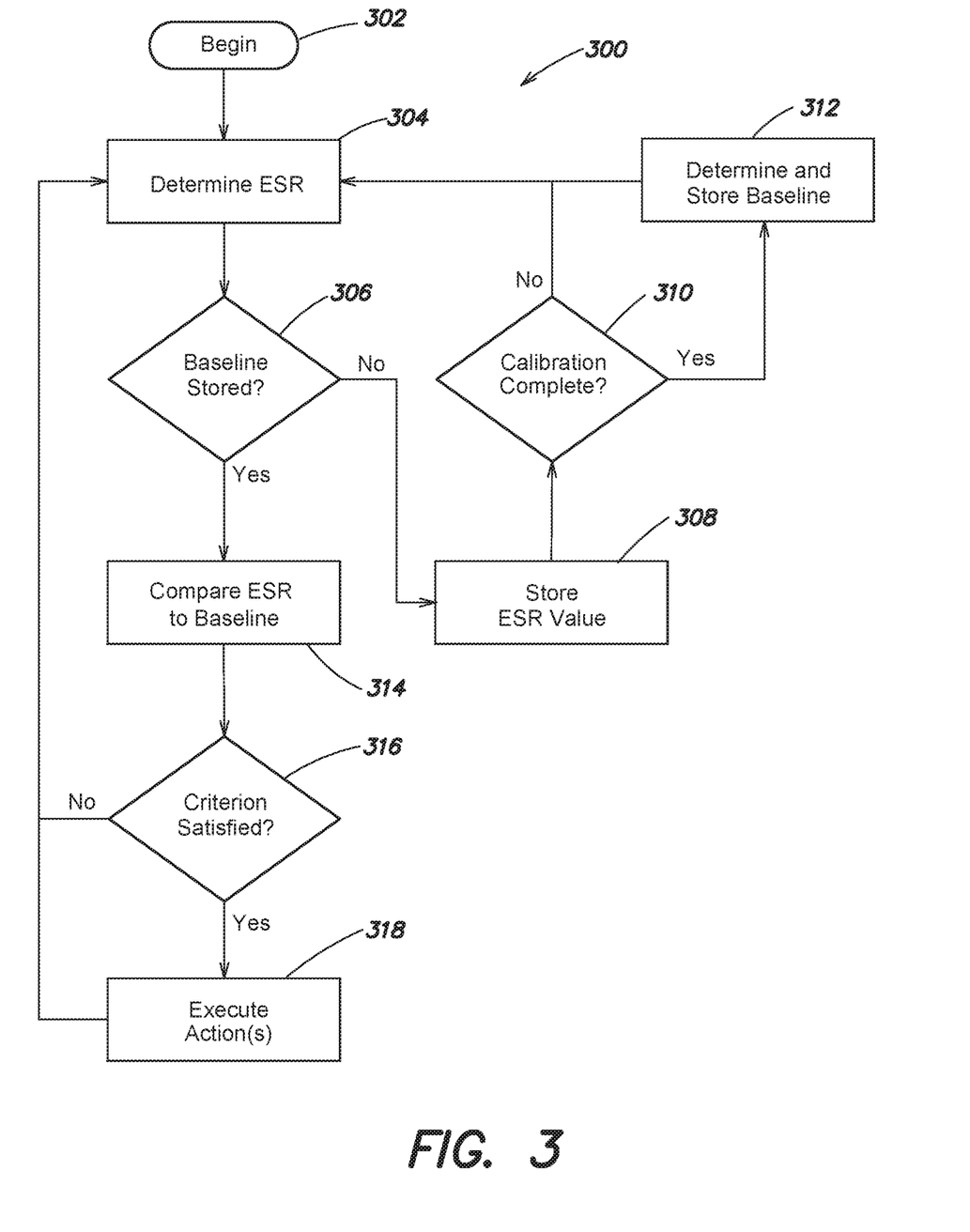
FIG. 3 illustrates a process of monitoring a capacitor according to an embodiment.

FIG. 3 illustrates a process 300 for monitoring an electrolytic capacitor according to an embodiment. In at least one embodiment, the process 300 is executed by a controller, such as a controller of a UPS. At act 302, the process 300 begins. At act 304, an ESR value of the electrolytic capacitor is determined, as discussed in greater detail below.

At act 306, a determination is made as to whether a baseline ESR value has been acquired. For example, the controller may determine if a baseline ESR value is stored in a local memory. The baseline ESR value may have been previously determined by the controller, or may have been retrieved from a list of known baseline values associated with the type of electrolytic capacitor being analyzed (received, for example, from a capacitor manufacturer). If a baseline value has not been previously stored (306 NO), then the process 300 continues to act 308.

At act 308, the ESR value determined at act 304 is stored. For example, the ESR value may be stored in a memory or storage accessible to the controller. At act 310, a determination is made as to whether calibration of the baseline value is complete. For example, calibration may be considered complete after a specified period of time has elapsed since a first ESR value was acquired, or after a threshold number of ESR values has been acquired.

If the calibration period is incomplete (310 NO), then the process 300 returns to act 304. Acts 304, 306, 308, and 310 are repeated until the calibration period is complete. In some embodiments, a delay is introduced before a subsequent ESR value is determined. If the calibration period is complete (310 YES), then the process 300 continues to act 312.

At act 312, a baseline value is determined and stored. For example, the controller may determine an average of the stored ESR values collected over a calibration period, and store the averaged value as a baseline value. The process 300 continues to act 304, where a new ESR value is determined, and continues to act 306, where a determination is made as to whether a baseline value has been stored. In some embodiments, a delay is introduced before a subsequent ESR value is determined.

Responsive to determining that a baseline value has been stored (306 YES), the process 300 continues to act 314. At act 314, the ESR value determined at act 304 is compared to the stored baseline value to generate a relative ESR value. For example, the relative ESR value may be expressed as a percentage value. At act 316, a determination is made as to whether the capacitor satisfies at least one criterion. For example, the criterion may include the relative ESR value of the capacitor exceeding one or more threshold values (for example, 200%, 250%, 400%, etc.).

If the capacitor does not satisfy at least one criterion (316 NO), then the process returns to act 304. In some embodiments, such as where the criterion is related to the relative ESR value of the capacitor, a delay is introduced before a subsequent ESR value is determined. Otherwise, if the capacitor satisfies at least one criterion (316 YES), then the process 300 continues to act 318.

At act 318, the controller executes one or more actions in response to the capacitor satisfying the at least one criterion. For example, in one embodiment, the controller may implement three relative ESR value thresholds. If the relative ESR value exceeds a first threshold (for example, 200%), then the controller may communicate an alert message to at least one user to replace the electrolytic capacitor. If the relative ESR value exceeds the first threshold and a second threshold (for example, 300%), then the controller may send another alert message to the at least one user, and inform the user that the electrolytic capacitor will be automatically shut off after a period of time (for example, 100 hours) has elapsed. For example, the controller may automatically switch out the electrolytic capacitor and switch in a new electrolytic capacitor, or may power down the device in which the electrolytic capacitor is implemented.

If the relative ESR value exceeds the first threshold, the second threshold, and a third threshold (for example, 400%), then the controller may send another alert message to the at least one user, and automatically shut off the electrolytic capacitor. For example, the controller may automatically power down the device in which the electrolytic capacitor is implemented, or may switch out the electrolytic capacitor and continue to run without the electrolytic capacitor.

In alternate embodiments, the controller may implement more or less than three thresholds. For example, the controller may communicate a warning message to a user after a first threshold is exceeded (for example, 200%), and may automatically power down the device in which the electrolytic capacitor is implemented (for example, a UPS) after a second threshold is exceeded (for example, 400%). After the one or more actions are executed at act 318, the process 300 returns to act 304. In some embodiments, a delay is introduced before a subsequent ESR value is determined.

It is to be appreciated that the criteria identified above are for purposes of example only, and that any criteria may be specified. Additionally, the identified actions executed at act 318 responsive to satisfying the one or more criteria are for purposes of example only. Any action or actions may be taken in response to satisfying the one or more criteria, including taking no action.

Determining the value of the ESR 104, as discussed above with respect to act 304, will now be described in greater detail. As discussed above, the ESL 102, ESR 104, and the ideal capacitor 106 represent an equivalent circuit of the electrolytic capacitor 100, and are not physical, discrete components. Accordingly, because the ESR 104 is not a discrete resistor, the value of the ESR 104 may not be directly measured by conventional methods, such as by implementation of an ohmmeter.

The value of the ESR 104 may, however, be derived from measurements taken from the electrolytic capacitor 100 as a whole. As will be understood by one of ordinary skill in the art, the impedance values of the equivalent components in the electrolytic capacitor 100 are governed by Equations (1)-(4), $$Z_{ESR} = R_{ESR} \quad (1)$$

$$Z_C = \frac{1}{2\Pi fC} \quad (2)$$

$$Z_{ESL} = 2\Pi fL \quad (3)$$

$$Z_{total} = Z_{ESR} + Z_C + Z_{ESL} \quad (4)$$

where $Z_{ESR}$ is the impedance of the ESR 104, $R_{ESR}$ is the resistance of the ESR 104, $Z_C$ is the impedance of the ideal capacitor 106, C is the capacity of the ideal capacitor 106, f is the frequency of a signal applied to the electrolytic capacitor 100, $Z_{ESL}$ is the impedance of the ESL 102, L is the inductance of the ESL 102, and $Z_{total}$ is the impedance of the electrolytic capacitor 100.

Figure 4:
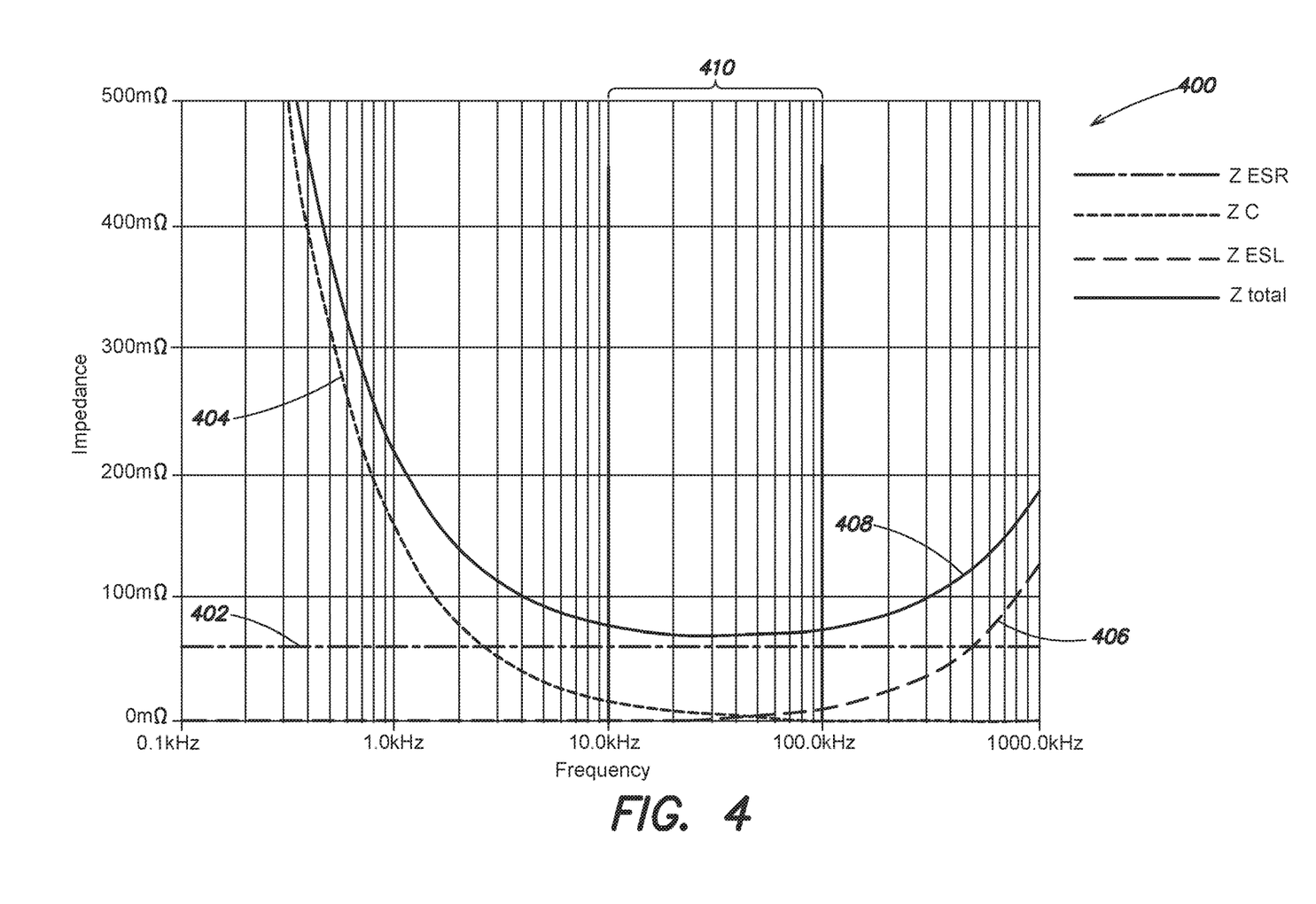
FIG. 4 illustrates a graph of a frequency response of a capacitor according to an embodiment.

FIG. 4 illustrates a graph 400 of values of $Z_{ESR}$, $Z_C$, $Z_{ESL}$, and $Z_{total}$ for an example capacitor over a range of frequencies. The graph 400 includes a $Z_{ESR}$ trace 402, a $Z_C$ trace 404, a $Z_{ESL}$ trace 406, and a $Z_{total}$ trace 408. The $Z_{ESR}$ trace 402 indicates a value of the impedance of the ESR 104. The $Z_C$ trace 404 indicates a value of the impedance of the ideal capacitor 106. The $Z_{ESL}$ trace 406 indicates a value of the impedance of the ESL 102. The $Z_{total}$ trace 408 indicates a value of the impedance of the electrolytic capacitor 100.

The vertical axis of the graph 400 indicates the impedance of the electrolytic capacitor 100. The horizontal axis of the graph 400 indicates a frequency of a signal provided to the electrolytic capacitor 100. For example, the signal may be a voltage signal provided to the electrolytic capacitor 100.

Over a first frequency range 410, which extends approximately from 10 kHz to 100 kHz, the impedance of the ideal capacitor 106 and the impedance of the ESL 102 are approximately zero as illustrated by the $Z_C$ trace 404 and the $Z_{ESL}$ trace 406. As indicated by Equation (4), $Z_{total}$ is roughly equal to $Z_{ESR}$ when $Z_{ESL}$ and $Z_C$ are approximately zero. Accordingly, if the frequency of the signal provided to the electrolytic capacitor 100 is within the first frequency range 410, $Z_{ESR}$ can be approximated by measuring the impedance of the electrolytic capacitor 100, $Z_{total}$, which can be directly measured.

For example, where the electrolytic capacitor is implemented in certain modular UPS systems, the modular UPS system may operate at a switching frequency of approximately 16 kHz-40 kHz, which is within the first frequency range 410. Because $Z_{total}$ is a substantially resistive load over the first frequency range 410 (i.e., because the reactive portion of $Z_{total}$ is approximately zero, and the voltage waveform is approximately in phase with the current waveform), the value of $Z_{total}$ can be measured using Equation (6), $$Z_{total} = Z_{ESR} = \frac{V}{I} \quad (6)$$

where V is the voltage applied to the electrolytic capacitor 100, and I is the current through the electrolytic capacitor 100. Accordingly, where the electrolytic capacitor 100 is implemented in the exemplary UPS described above, the value of the ESR 104 can be estimated while the UPS is operating by measuring the voltage across the electrolytic capacitor 100 and the current through the electrolytic capacitor 100.

In some embodiments, the calculation of the ESR 104 may be skipped based on the values of the voltage applied to the electrolytic capacitor 100 and the current through the electrolytic capacitor 100. For example, the current through the electrolytic capacitor 100 may be so small that calculating the ESR 104 is difficult or impossible (for example, where the current value is zero). Accordingly, current and/or voltage criteria (for example, a minimum current threshold) may need to be satisfied before the ESR 104 is calculated in some embodiments.

Figure 5:
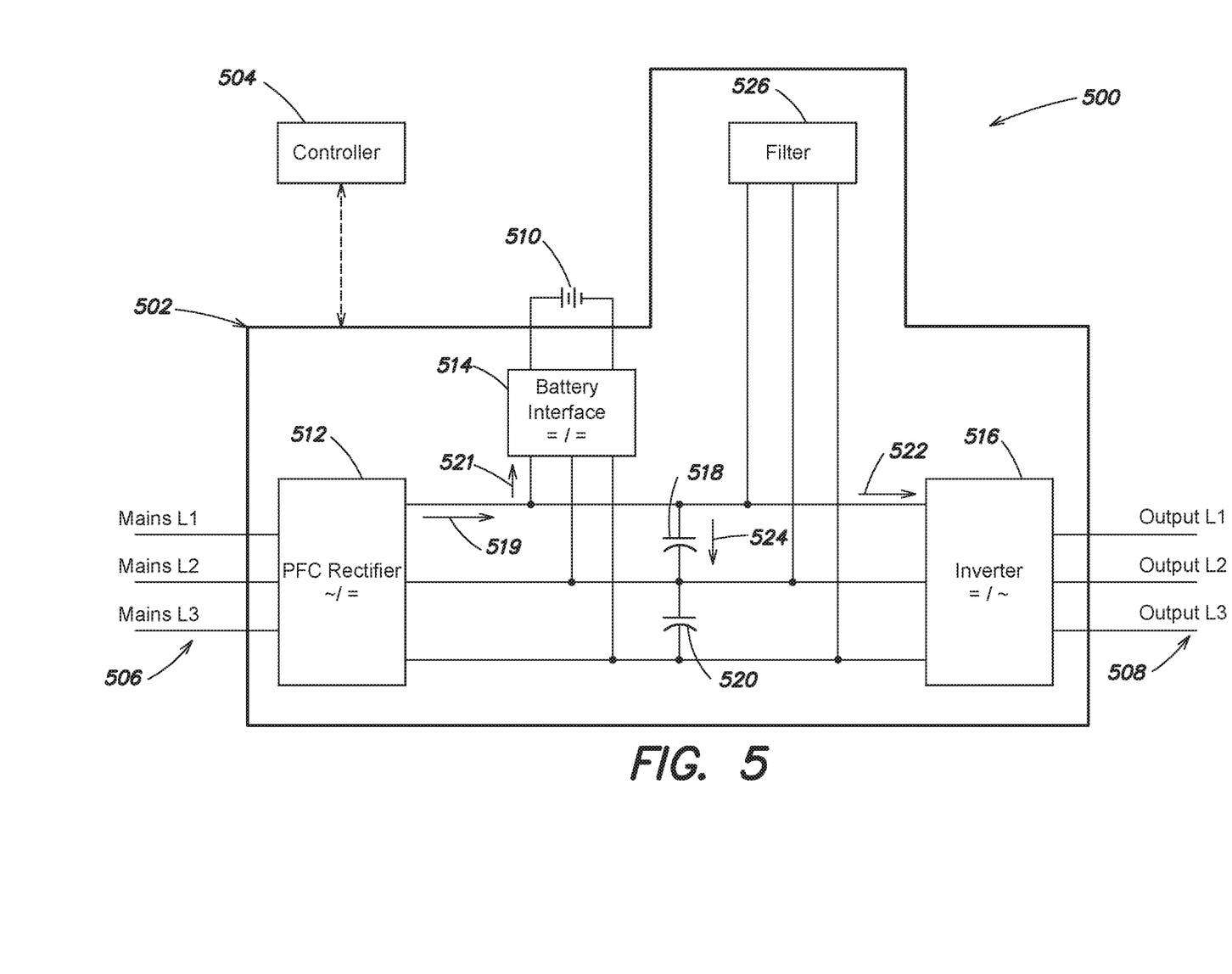
FIG. 5 illustrates a block diagram of an Uninterruptible Power Supply (UPS) according to an embodiment.

FIG. 5 illustrates a block diagram of a UPS 500 according to an embodiment. The UPS 500 includes power conversion circuitry 502 and a controller 504. The power conversion circuitry 502 is configured to be coupled to a plurality of input lines 506, a plurality of output lines 508, and a battery 510, and is configured to be communicatively coupled to the controller 504. The controller 504 is configured to be communicatively coupled to the power conversion circuitry 502. In some embodiments the battery 510 is part of the power conversion circuitry 502, and in other embodiments, the power conversion circuitry 502 is configured to be coupled to the battery 510.

The power conversion circuitry 502 includes a Power Factor Correction (PFC) rectifier 512, a battery interface 514, an inverter 516, a filter 526, a first electrolytic capacitor 518, and a second electrolytic capacitor 520. The PFC rectifier 512 is configured to be coupled to the plurality of input lines 506, the battery interface 514, the inverter 516, the filter 526, the first electrolytic capacitor 518, and the second electrolytic capacitor 520. The battery interface 514 is configured to be coupled to the battery 510, the PFC rectifier 512, the inverter 516, the filter 526, the first electrolytic capacitor 518, and the second electrolytic capacitor 520.

The inverter 516 is configured to be coupled to the plurality of output lines 508, the PFC rectifier 512, the battery interface 514, the filter 526, the first electrolytic capacitor 518, and the second electrolytic capacitor 520. The filter 526 is coupled to the PFC rectifier 512, the battery interface 514, the inverter 516, the first electrolytic capacitor 518, and the second electrolytic capacitor 520. The first electrolytic capacitor 518 is configured to be coupled to the PFC rectifier 512, the battery interface 514, the inverter 516, the filter 526, and the second electrolytic capacitor 520. The second electrolytic capacitor 520 is configured to be coupled to the PFC rectifier 512, the battery interface 514, the inverter 516, the filter 526, and the first electrolytic capacitor 518.

In operation, the power conversion circuitry 502 is generally configured to receive AC input power at the plurality of input lines 506 and provide uninterrupted power to the plurality of output lines 508. The controller 504 receives measurement signals from the power conversion circuitry 502 and controls the power conversion circuitry 502 based on the measurement signals. For example, the measurement signals may be current or voltage signals collected to analyze a power quality of power received at the plurality of input lines 506.

If the controller 504 determines that the quality of the AC input power received by the power conversion circuitry 502 at the plurality of input lines 506 is acceptable (i.e., having power quality parameters within a threshold range), then the controller 504 initiates a normal mode of operation. Otherwise, if the controller 504 determines that the quality of the AC input power received by the power conversion circuitry 502 at the plurality of input lines 506 is not acceptable (i.e., having power quality parameters outside of the threshold range), then the controller 504 initiates a backup mode of operation.

In the normal mode of operation, the controller 504 controls the PFC rectifier 512 to condition the AC input power received at the plurality of input lines 506 by providing PFC to the AC input power and rectifying the AC input power. The PFC rectifier 512 provides the conditioned DC power to the battery interface 514, the inverter 516, the first electrolytic capacitor 518, and the second electrolytic capacitor 520.

The battery interface 514 receives the conditioned DC power, converts the conditioned DC power to a different DC voltage level, and charges the battery 510 with the converted DC power based on control signals received from the controller 504. The inverter 516 receives the conditioned DC power, converts the conditioned DC power to AC power, and provides the AC power to the plurality of output lines 508 based on control signals received from the controller 504. The filter 526 may include, for example, at least one DC blocking capacitor. The first electrolytic capacitor 518 and the second electrolytic capacitor 520 provide a DC link and load-balancing between the PFC rectifier 512 and the inverter 516.

In the backup mode of operation, the PFC rectifier 512 does not condition the AC input power or provide the power to any of the components 514-520 because no acceptable AC input power is available. The battery interface 514 draws DC power from the battery 510, converts the DC power to a different voltage level, and provides the converted DC power to the inverter 516, the first electrolytic capacitor 518, and the second electrolytic capacitor 520 based on control signals received from the controller 504.

The inverter 516 receives the converted DC power, converts the converted DC power to AC power, and provides the AC power to the plurality of output lines 508 based on control signals received from the controller 504. The filter 526 filters out low-frequency signals. The first electrolytic capacitor 518 and the second electrolytic capacitor 520 provide a DC link and load-balancing between the battery interface 514 and the inverter 516. In some embodiments, in the normal mode of operation, output power may be provided based on power from the AC input and battery power.

In at least one embodiment, as will now be described, the UPS 500 is configured to estimate the lifetime of the first electrolytic capacitor 518 and/or the lifetime of the second electrolytic capacitor 520. The first electrolytic capacitor 518 is substantially similar to the electrolytic capacitor 100 discussed above, inasmuch as the lifetime of the first electrolytic capacitor 518 may be estimated by calculating a value of the ESR of the first electrolytic capacitor 518. In at least one example, the power conversion circuitry 502 is operating at a switching frequency of approximately 16 kHz-40 kHz, which is within the first frequency range 410 discussed above. Accordingly, the value of the ESR of the first electrolytic capacitor 518 can be calculated using Equation (6) above, using values of the current through the first electrolytic capacitor 518 and the voltage across the first electrolytic capacitor 518.

To calculate the current through the first electrolytic capacitor 518, it is useful to label a plurality of currents in the power conversion circuitry 502. The PFC rectifier 512 provides a PFC current $I_{PFC}$ 518. The battery interface 514 receives a converter current $I_{converter}$ 520. The inverter 516 receives an inverter current $I_{inverter}$ 522. The first electrolytic capacitor 518 receives a capacitor current $I_{capacitor}$ 524. The filter 526 receives a negligible current, at least because the filter 526 behaves approximately as an open circuit absent a transient event. Applying Kirchoff's law, the capacitor current $I_{capacitor}$ 524 can be calculated as follows, $$I_{PFC} = I_{converter} + I_{inverter} + I_{capacitor} \tag{7}$$

which may be rearranged to yield the equation, $$I_{capacitor} = I_{PFC} - I_{inverter} - I_{converter} \tag{8}$$

In some embodiments, the PFC rectifier 512, the battery interface 514, and the inverter 516 include current sensors (for example, Hall-effect sensors) that sense the PFC current $I_{PFC}$ 518, the converter current $I_{converter}$ 520, and the inverter current $I_{inverter}$ 522, and provide the measured current values to the controller 504. The capacitor current $I_{capacitor}$ 524 can therefore be calculated by inserting the sensed current values into Equation (8).

To calculate the voltage across the first electrolytic capacitor 518, a voltage across the filter 526 is calculated. Because the filter 526 is configured to be coupled in parallel with the first electrolytic capacitor 518, the voltage across the DC blocking capacitor is substantially identical to the voltage across the first electrolytic capacitor 518. Accordingly, the AC voltage measured after the DC blocking capacitor filters the AC signal may be communicated to the controller 504 to determine the AC voltage across the first electrolytic capacitor 518.

Responsive to receiving the current value through the first electrolytic capacitor 518 and the voltage value across the first electrolytic capacitor 518, the controller 504 is capable of calculating the ESR of the first electrolytic capacitor 518 using Equation (6). Similar principles apply to calculating the ESR of the second electrolytic capacitor 520.

An example will now be provided in which the controller 504 executes the process 300 to analyze the first electrolytic capacitor 518. At act 302, the process 300 begins. At act 304, the controller 504 determines an ESR value of the first electrolytic capacitor 518 using Equation (6). The controller 504 polls the PFC rectifier 512, the battery interface 514, the inverter 516, and the filter 526 to determine the input values to Equation (6), including the current through the first electrolytic capacitor 518 and the voltage across the first electrolytic capacitor 518.

At act 306, the controller 504 determines whether a baseline value has been stored. For example, the controller 504 may poll a memory to determine if a baseline value has been previously calculated or obtained from a list of baseline values and stored in the memory. If not (306 NO), then at act 308 the controller 504 stores the ESR value determined at act 304 in a memory, and the process 300 continues to act 310.

At act 310, the controller 504 determines whether a calibration period has been completed. For example, the controller 504 may determine if a specified period of time (for example, one week) has elapsed since the first electrolytic capacitor 518 was implemented. If the calibration period has not been completed (310 NO), then the process 300 returns to act 304, and acts 304-310 are repeated. If the calibration period has been completed (310 YES), the process 300 continues to act 312.

At act 312, the baseline value is determined and stored. For example, determining the baseline value may include averaging the ESR values determined and stored throughout the calibration period. The process 300 continues to act 304, where an ESR value is determined, and continues to act 306, where a determination is made as to whether a baseline value has been stored. If a baseline value has been stored (306 YES), the process continues to act 314.

At act 314, the controller 504 compares the ESR value determined at act 304 with the stored baseline value to generate a relative ESR value. For example, the stored baseline value may be approximately 55 ma and the ESR value determined at act 304 may be approximately 116 mΩ. Accordingly, where the relative ESR value is expressed as a percentage, the controller 504 may determine that the relative ESR value is approximately 211%.

At act 316, the controller 504 determines if at least one relative ESR value criterion has been satisfied. For example, the controller 504 may determine if the relative ESR value exceeds a first threshold (200%), a second threshold (300%), or a third threshold (400%). In other embodiments, the controller 504 may reference any number of thresholds having any associated value.

If the controller 504 determines that no threshold(s) have been exceeded (316 NO), then the process 300 returns to act 304. If the controller 504 determines that the relative ESR value exceeds at least one threshold (316 YES), then the process 300 continues to act 318. For example, continuing with the example above, the relative ESR value of 211% exceeds the first threshold (200%), but not the second threshold (300%) or the third threshold (400%).

At act 318, the controller 504 executes one or more actions responsive to the at least one threshold being exceeded. For example, if the controller 504 determines that only a first threshold has been exceeded, then the controller 504 may notify a user that the first electrolytic capacitor 518 should be replaced soon. If the controller 504 determines that the first threshold and a second threshold have been exceeded, then the controller 504 may notify a user that the first electrolytic capacitor 518 should be replaced imminently. The controller 504 may also automatically shut off some or all of the components of the power conversion circuitry 502 after a specified time period. If the controller 504 determines that the first threshold, the second threshold, and a third threshold have been exceeded, then the controller 504 may automatically initiate a safe shutdown of the power conversion circuitry 502 to avoid failure of the first electrolytic capacitor 518. The process 300 returns to act 304.

In some examples, there may be a delay between determining successive ESR values at act 304. For example, the controller 504 may determine an ESR value once per day, once per week, once per month, or any other time period. In alternate embodiments, the controller 504 may determine ESR values dynamically depending on the status of the first electrolytic capacitor 518. For example, if the controller 504 determines that the first electrolytic capacitor 518 is nearing an end of life, then the controller 504 may increase the rate at which an ESR value of the first electrolytic capacitor 518 is determined.

In some embodiments, the controller 504 may employ hysteresis at act 316 to determine whether a threshold has been exceeded. For example, the controller 504 may require that at least three successive relative ESR values satisfy one or more criteria before determining that the ESR of the first electrolytic capacitor 518 actually satisfies the one or more criteria. Employing hysteresis allows the controller 504 to filter out transient values which may not accurately reflect the status of the first electrolytic capacitor 518.

In some examples, the ESR value determined at act 304 is normalized based on ambient temperature. As discussed above, an electrolytic capacitor's ESR value varies depending on the ambient temperature. Accordingly, it may be advantageous to account for ambient temperature to accurately interpret the ESR of an electrolytic capacitor.

Figure 6:
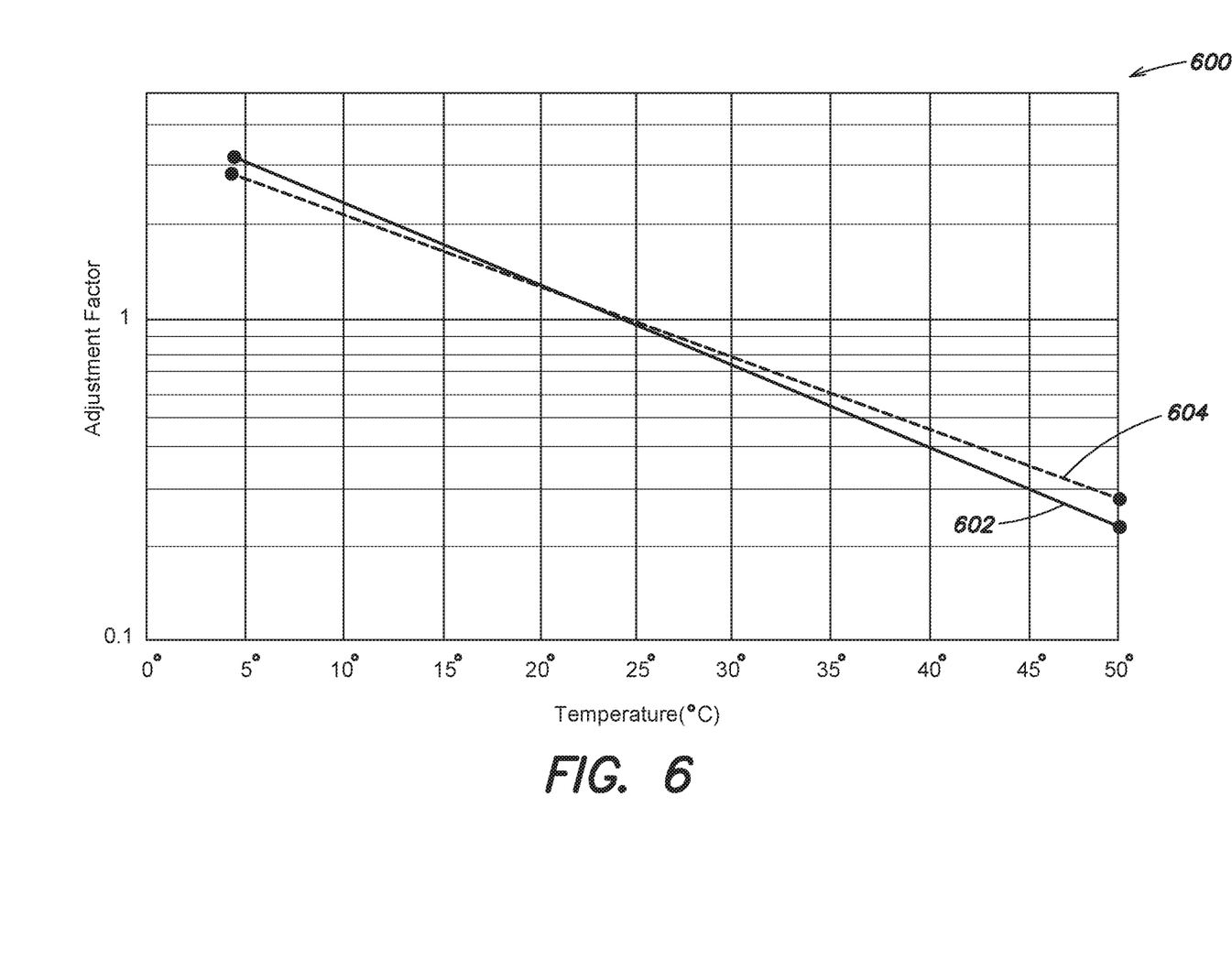
FIG. 6 illustrates a graph of a plurality of capacitor ESR values with respect to temperature according to an embodiment.

FIG. 6 illustrates a graph 600 of ESR as a function of ambient temperature. The graph 600 includes a first electrolytic capacitor trace 602 indicative of a first electrolytic capacitor of a first type, and a second electrolytic capacitor trace 604 indicative of a second electrolytic capacitor of a second type. The horizontal axis of the graph 600 indicates an ambient temperature of an electrolytic capacitor. The vertical axis of the graph 600 indicates a scalar adjustment factor of an ESR value of an electrolytic capacitor.

For example, as indicated by the first electrolytic capacitor trace 602, an ESR value of the first electrolytic capacitor of the first type at 10° C. is approximately twice the ESR value of the first electrolytic capacitor of the first type at 23° C. Accordingly, it is to be appreciated that the ESR value determined at act 304, above, may be adjusted for ambient temperature to determine if a change in an electrolytic capacitor ESR value is due to the status of the electrolytic capacitor, or due to the ambient temperature of the electrolytic capacitor.

Where the controller 504, for example, is configured to implement temperature-based ESR normalization, the controller 504 may receive information indicative of temperature-induced ESR fluctuations specific to a variety of electrolytic capacitor models. In alternate embodiments, the controller 504 may undergo a temperature calibration process whereby the controller 504 measures an electrolytic capacitor's response to a variety of ambient temperatures. Similar temperature-based adjustments may be applied where, for example, the temperature of the electrolytic capacitor is affected by operating of the electrolytic capacitor (for example, heating up due to the presence of a ripple current).

In some embodiments, the measurement of the current through the first electrolytic capacitor 518 is synchronized with the measurement of the voltage across the first electrolytic capacitor 518 such that the measurements are performed roughly simultaneously. In alternate embodiments, a delay may exist between one or more measurements indicative of a voltage across the electrolytic capacitor and one or more measurements indicative of a current through the electrolytic capacitor. The delay may be intentional or unintentional.

For example, in one embodiment, a delay of approximately 1 μs may exist between acquisition of an electrolytic capacitor voltage measurement and acquisition of one or more current measurements used to calculate a current through the electrolytic capacitor. The delay may be compensated by calculating a rate of change for one or more of the voltage or current values, and adjusting the values based on the rate of change. For example, the rate of change of the one or more current measurements can be calculated and based on the rate of change, the delay, and the value(s) of the one or more current measurements, an adjusted current calculation can be performed to determine a value(s) of the measured currents at the time the voltage measurement was performed.

It is to be appreciated that a method of calculating an ESR value of an electrolytic capacitor (for example, an electrolytic capacitor implemented in a UPS) by a controller has been provided. The ESR value can be correlated to the lifetime of the electrolytic capacitor such that imminent electrolytic capacitor failure can be detected before dangerous failure occurs. If imminent electrolytic capacitor failure is detected, a number of actions may be taken in response thereto. For example, responsive actions include notifying a user, automatically replacing the electrolytic capacitor, or powering down the device that the electrolytic capacitor is installed in, such that dangerous failure of the electrolytic capacitor is mitigated or avoided.

The method may be executed with minimal modification to an existing power device structure, and therefore may be implemented with minimal cost. For example, with respect to the UPS 500 discussed above, the PFC rectifier 512, battery interface 514, and the inverter 516 may already include current sensors to communicate feedback signals to the controller 504 to facilitate control of the power conversion circuitry 502, and the UPS 500 may already include voltage sensors corresponding to one or both of the first electrolytic capacitor 518 and the second electrolytic capacitor 520 to communicate feedback signals to the controller 504. For example, current and voltage monitoring techniques within UPSs are described in WIPO Publication No. WO2015/084337, titled IMPROVEMENT OF INVERTER REGULATION, which is hereby incorporated by reference in its entirety. Similarly, the filter 526 may be a preexisting component configured to block DC signals. In some examples, the controller 504 may include an additional analog-to-digital input to facilitate communication of a voltage measurement across the filter 526 to the controller 504.

Although some of the foregoing examples provide one or more actions being executed responsive to a relative value exceeding a threshold, in alternate embodiments, one or more actions may be executed responsive to one of several criteria being satisfied. For example, one or more actions may be executed responsive to an ESR value meeting a specific value, such as 100 mΩ, absent comparison to a baseline value. In an alternate example, one or more actions may be executed responsive to an ESR value or a relative ESR value falling below a specified threshold.

Furthermore, although the foregoing discussion and accompanying figures include actions executed in connection with a first and second electrolytic capacitor, any number of capacitors may be utilized in any configuration in connection with the foregoing discussion. For example, the first electrolytic capacitor 518 may be replaced by two or more capacitors connected in parallel. In an example in which eight capacitors are connected in parallel, the measured impedance represents the impedance of the parallel configuration, from which the individual capacitances may be extrapolated (i.e., as $\frac{1}{8}^{th}$ of the impedance of the parallel configuration).

In some examples, the controller 504 can include one or more processors or other types of controllers. The controller 504 may perform a portion of the functions discussed herein on a processor, and perform another portion using an Application-Specific Integrated Circuit (ASIC) tailored to perform particular operations. Examples in accordance with the present invention may perform the operations described herein using many specific combinations of hardware and software and the invention is not limited to any particular combination of hardware and software components. The controller 504 may include, or may be communicatively coupled to, a non-transitory computer-readable medium configured to store instructions which, when executed by the controller 504, cause the controller 504 to execute one or more acts discussed above with respect to FIG. 3.

In some embodiments, the controller 504 may be coupled to a display, a storage element, and one or more input/output modules. For example, the controller 504 may communicate results of an ESR analysis to the display responsive to commands received from a user via the input/output modules, such that a user may view the results of the analysis. The controller 504 may also or alternatively store the results of the analysis in the storage element for subsequent retrieval.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An Uninterruptible Power Supply (UPS) system, the UPS system comprising:
    an input configured to receive input power;
    an output configured to provide output power to a load;
    power conversion circuitry coupled to the input and the output;
    a capacitor coupled to the power conversion circuitry; and
    a controller coupled to the power conversion circuitry, the controller configured to:
        determine a first value indicative of a first equivalent series resistance of the capacitor;
        identify a baseline equivalent series resistance based on the first value;
        determine a second value indicative of a second equivalent series resistance of the capacitor;
        determine if the second value exceeds the baseline equivalent series resistance by a specified amount; and
        execute, responsive to determining that the second value exceeds the baseline equivalent series resistance by the specified amount, one or more actions to address degradation of the capacitor,
            wherein the one or more actions include notifying a user of the degradation of the capacitor,
            wherein the specified amount is a first specified amount, and wherein the controller is further configured to determine that the second value exceeds the baseline equivalent series resistance by a second specified amount, and
            wherein the first specified amount is a first multiple of the baseline equivalent series resistance and the second specified amount is a second multiple of the baseline equivalent series resistance, the second multiple being greater than the first multiple.

2. The UPS system of claim 1, further comprising a filter coupled in parallel with the capacitor.

3. The UPS system of claim 2, wherein the controller is configured to determine a third value indicative of a voltage across the filter, and determine at least one fourth value indicative of at least one current through the power conversion circuitry.

4. The UPS system of claim 3, wherein the controller is configured to determine the first value indicative of the first equivalent series resistance of the capacitor based on the third value indicative of the voltage across the filter and based on the at least one fourth value indicative of the at least one current through the power conversion circuitry.

5. The UPS system of claim 1, wherein determining that the second value exceeds the baseline equivalent series resistance by the first specified amount includes determining that the second value exceeds the baseline equivalent series resistance by a specified proportion of the baseline equivalent series resistance.

6. The UPS system of claim 1, wherein the one or more actions include notifying the user of the degradation of the capacitor responsive to the second value exceeding the first specified amount, and initiating a safe shutdown of the UPS system responsive to the second value exceeding the second specified amount.

7. A method for detecting degradation of performance of a capacitor in a device, the method comprising:
   determining a first value indicative of a first equivalent series resistance of the capacitor;
   identifying a baseline equivalent series resistance based on the first value;
   determining a second value indicative of a second equivalent series resistance of the capacitor;
   determining that the second value exceeds the baseline equivalent series resistance by a first specified amount;
   determining that the second value exceeds the baseline equivalent series resistance by a second specified amount, the first specified amount being a first multiple of the baseline equivalent series resistance and the second specified amount being a second multiple of the baseline equivalent series resistance, the second multiple being greater than the first multiple; and
   executing, responsive to determining that the second value exceeds the baseline equivalent series resistance by the first specified amount, one or more actions to address degradation of the capacitor, the one or more actions including notifying a user of the degradation of the capacitor.

8. The method of claim 7, wherein determining each of the first value and the second value respectively includes:
   determining a voltage value across the capacitor;
   determining a current value through the capacitor; and
   determining an impedance of the capacitor based on the voltage value and the current value.

9. The method of claim 7, further comprising:
   determining a plurality of values indicative of the baseline equivalent series resistance of the capacitor, the plurality of values including the first value;
   generating the baseline equivalent series resistance using the plurality of values; and
   storing the baseline equivalent series resistance.

10. The method of claim 7, further comprising normalizing the second value according to an ambient temperature.

11. The method of claim 7, wherein determining that the second value exceeds the baseline equivalent series resistance by the first specified amount includes determining that the second value exceeds the baseline equivalent series resistance by a specified proportion of the baseline equivalent series resistance.

12. The method of claim 11, wherein determining that the second value exceeds the baseline equivalent series resistance by the first specified amount includes determining that the second value is approximately two times larger than the baseline equivalent series resistance.

13. The method of claim 7, wherein the one or more actions include notifying the user of the degradation of the capacitor responsive to the second value exceeding the first specified amount, and initiating a safe shutdown of the device responsive to the second value exceeding the second specified amount.

14. An Uninterruptible Power Supply (UPS) system, the UPS system comprising:
   an input configured to receive input power;
   an output configured to provide the input power to a load;
   power conversion circuitry coupled to the input and the output;
   a capacitor coupled to the power conversion circuitry; and
   means for identifying a baseline equivalent series resistance of the capacitor, means for determining a value indicative of an equivalent series resistance of the capacitor, means for detecting degradation of the capacitor based on the equivalent series resistance of the capacitor exceeding the baseline equivalent series resistance by at least one of a first specified amount or a second specified amount, the first specified amount being a first multiple of the baseline equivalent series resistance and the second specified amount being a second multiple of the baseline equivalent series resistance, the second multiple being greater than the first multiple, and means for executing, responsive to determining that the equivalent series resistance exceeds the baseline equivalent series resistance by the first specified amount, one or more actions to address degradation of the capacitor, the one or more actions including notifying a user of the degradation of the capacitor.

* * * * *